United States Patent [19]

Hall et al.

[11] 4,388,671

[45] Jun. 14, 1983

[54] CATHODE RAY TUBE DISPLAY TERMINAL HAVING AN ENCLOSURE FOR PROTECTION OF A LOGIC BOARD

[75] Inventors: Roger L. Hall, Nashua, N.H.; Domenic R. Romano, Chelmsford, Mass.

[73] Assignee: Honeywell Information Systems Inc., Waltham, Mass.

[21] Appl. No.: 278,239

[22] Filed: Jun. 29, 1981

[51] Int. Cl.³ ................................. H05K 7/10; H05K 7/20
[52] U.S. Cl. ................................. 361/383; 361/391; 361/395; 361/399; 361/403
[58] Field of Search ............... 361/391, 390, 395, 394, 361/399, 403, 383; 358/454

[56] References Cited

U.S. PATENT DOCUMENTS

| 3,524,198 | 8/1970 | Malmstadt et al. | 361/395 |
| 3,668,476 | 6/1972 | Wrabel et al. | 361/395 X |
| 3,758,716 | 9/1973 | James et al. | 361/391 X |
| 3,867,672 | 2/1975 | Pizzigoni | 361/403 X |
| 3,895,267 | 7/1975 | Gordon et al. | 361/399 X |
| 4,218,724 | 8/1980 | Kaufman | 361/395 |
| 4,295,181 | 10/1981 | Chang et al. | 361/395 |
| 4,323,979 | 4/1982 | Johnston | 361/390 X |

FOREIGN PATENT DOCUMENTS 2808997  9/1979  Fed. Rep. of Germany ...... 361/395

Primary Examiner—R. R. Kucia
Attorney, Agent, or Firm—George Grayson; Nicholas Prasinos

[57] ABSTRACT

A cathode ray tube display terminal includes a printed circuit logic board permanently mounted in a molded plastic enclosure assembly during "on the shelf" storage and shipment of the enclosure as a spare part and during normal operation of the CRT display terminal. The enclosure assembly includes a top portion and a lower portion which snap together. The printed circuit logic board is assembled between the upper and lower portions of the enclosure which are secured by a single screw. A snap-out section allows replacement of a read only memory on the logic board.

7 Claims, 6 Drawing Figures

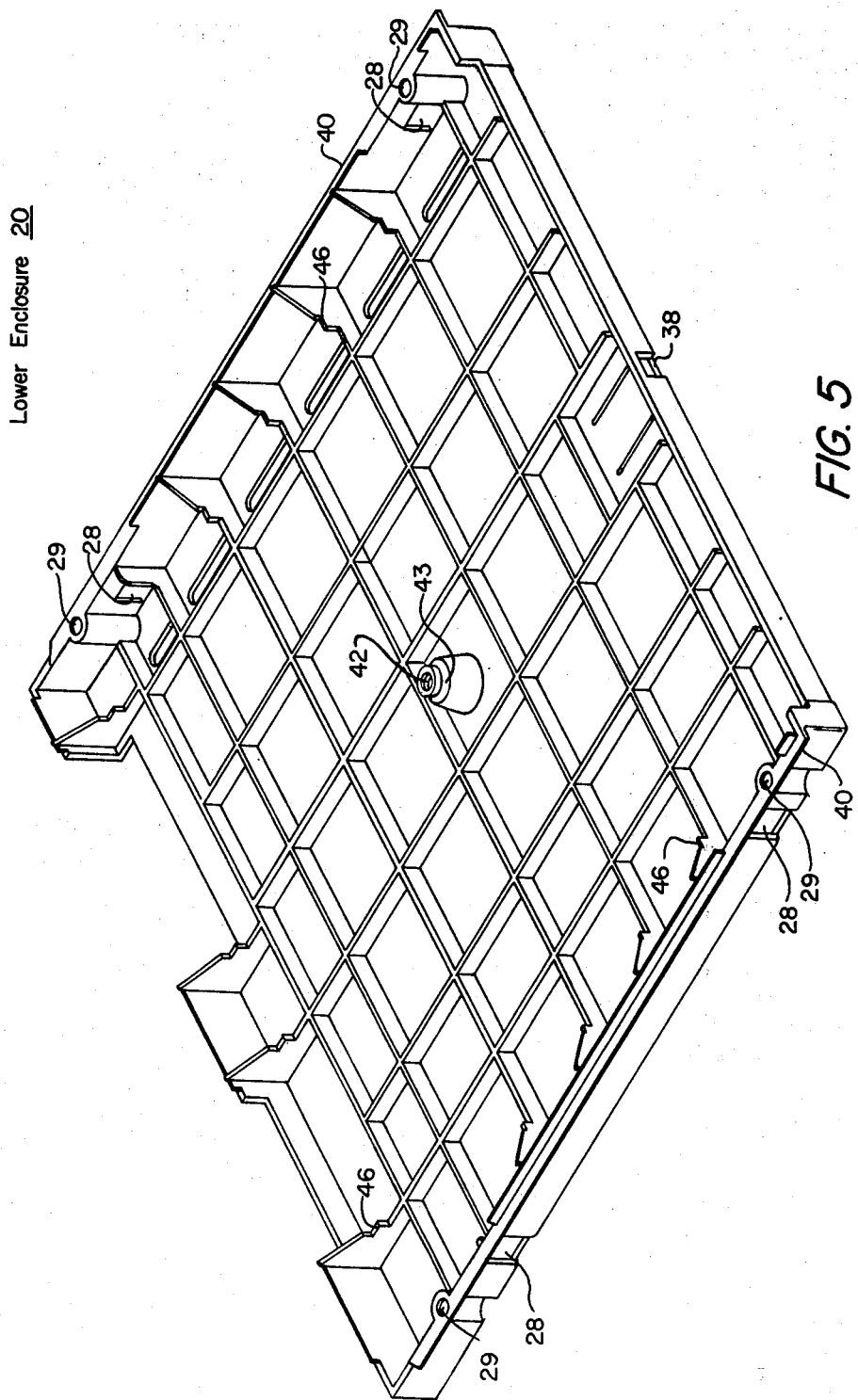

CATHODE RAY TUBE DISPLAY TERMINAL HAVING AN ENCLOSURE FOR PROTECTION OF A LOGIC BOARD

RELATED APPLICATIONS

The following patent application is assigned to the same assignee as the instant application and has been filed on an even date with the instant application.

"A Cathode Ray Tube Display Terminal with a Removable Power Supply" by Roger L. Hall and Walter J. Conroy, having Ser. No. 278,244 and filed on June 29, 1981.

BACKGROUND OF THE INVENTION

1. Field of the Invention

The invention relates generally to cathode ray tube display terminals and more specifically to the protection of the logic board during shipment and during normal operation of the terminals, thereby allowing customer replacement of the logic board without damage to the logic board or injury to the customer.

2. Description of the Prior Art

Many data processing systems include a cathode ray tube (CRT) display terminal in the system console. The operator uses the terminal to verify information before inserting the information into the system or to display information received from the system. The logic for controlling the CRT display terminal is included in the system console logic and is accessible to field maintenance personnel only.

Many more recent data processing systems include CRT display terminals coupled to communication lines. These terminals are installed at offices remote to the data processing system. Field maintenance personnel travel to the remote site to repair defective terminals. To reduce the maintenance cost, terminals are built with a modular construction enabling customer personnel to replace defective modules.

CRT display terminals, typically the IBM 3101, are built in two sections, one section including a power supply, miscellaneous switches and a logic board; and the other section including the cathode ray tube with its associated circuitry. Here customer personnel replace either section. Each section, however, is relatively complex and costly.

OBJECTS OF THE INVENTION

It is an object of the invention to build an improved CRT display terminal providing for maintenance by customer personnel.

It is another object of the invention to build an improved CRT display having a logic board that can be safely replaced by customer personnel.

It is yet another object of the invention to provide a means for protecting the logic board from damage during normal shipment of the logic board between sites.

It is still another object of the invention to provide a means for allowing customer personnel to replace the logic board without harm coming to the customer personnel.

It is still another object of the invention to protect the logic board from possible static discharge during handling which could damage the circuitry on the logic board.

SUMMARY OF THE INVENTION

A CRT display terminal includes a cathode ray tube display with its associated circuitry, a power supply and an enclosure assembly including a logic board. The enclosure assembly has molded-in slides which guide the enclosure assembly to engage a connector mounted in the CRT display terminal base. A snap-catch locks the enclosure assembly in place. The enclosure assembly is readily removable by depressing the snap-catch, thereby unlatching the enclosure assembly from the CRT display terminal.

The enclosure assembly includes a top portion and a bottom portion which snap together and a printed circuit logic board. The top and bottom portions and the logic board are secured by a single screw.

An opening in the top portion allows the customer to insert a read only memory logic element (character generator). A snap-in cover over the opening in the top portion supports the top edge of the read only memory module.

The logic board is protected against electrostatic discharge by providing flexible fingers to discharge static electricity to the grounded frame of the CRT display terminal.

BRIEF DESCRIPTION OF THE DRAWINGS

The novel features which are characteristic of the invention are set forth with particularity in the appended claims. The invention itself, however, both as to organization and operation may best be understood by reference to the following description in conjunction with the drawings in which.

FIG. 5 shows the bottom portion of the enclosure assembly; and

FIG. 6 shows a cross-sectional view of a portion of the top portion of the enclosure assembly.

DESCRIPTION OF THE PREFERRED EMBODIMENT

Figure 1:
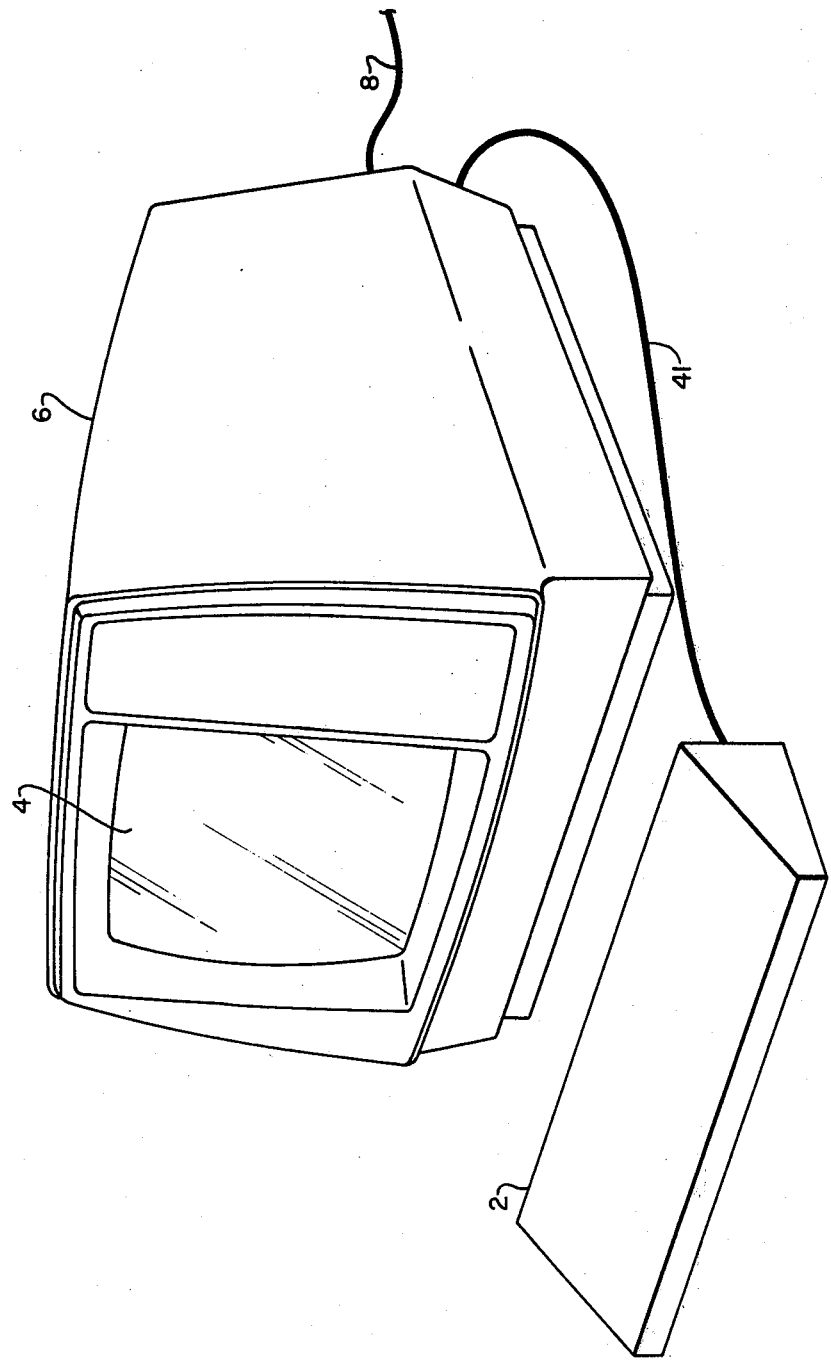
FIG. 1 shows a front view of the cathode ray tube display terminal.

FIG. 1 shows the cathode ray tube (CRT) display terminal 1 including a separable keyboard 2 and cable 41, a cathode ray tube (CRT) display 4, a cover 6 and a line cord 8.

Figure 2:
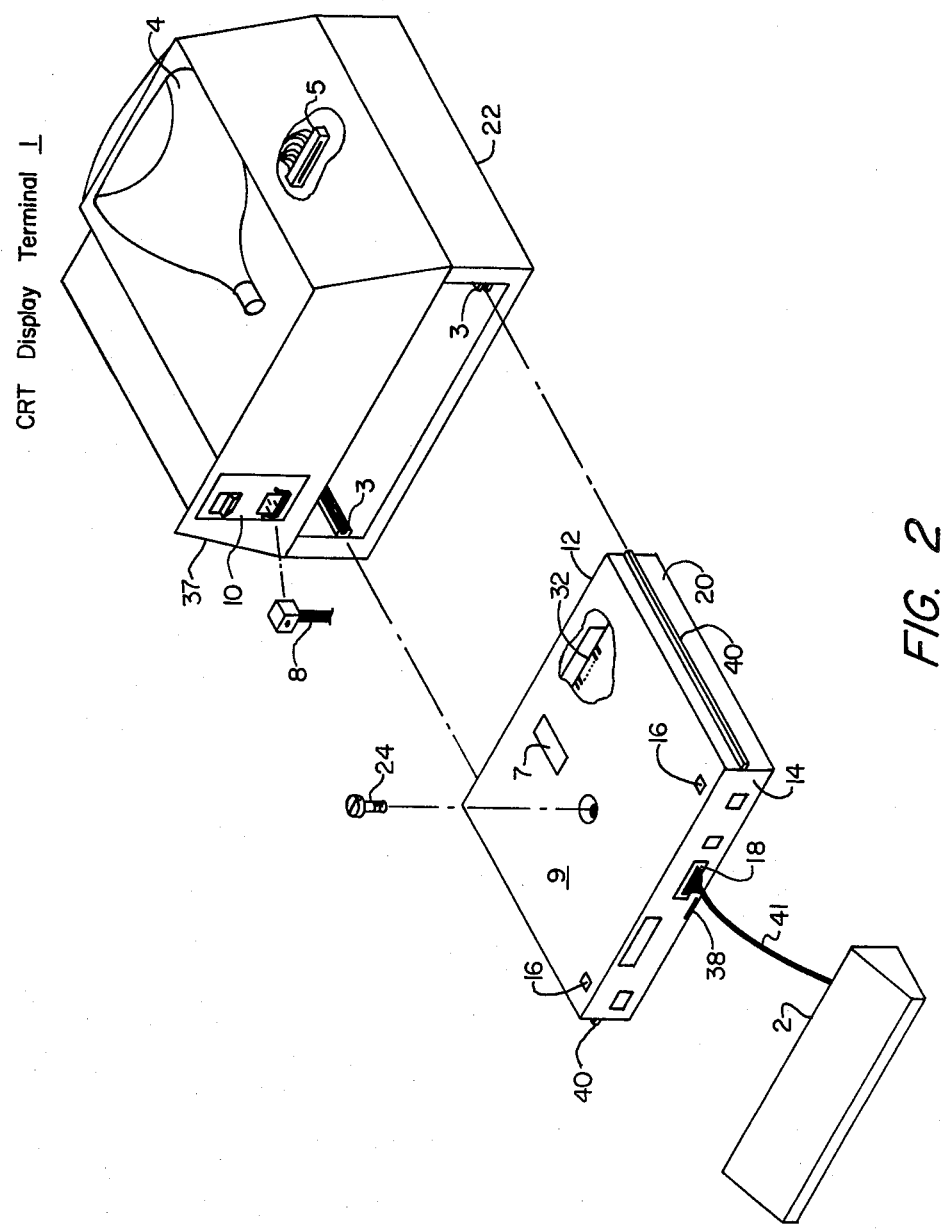
FIG. 2 shows an exploded view of the terminal from the rear.

FIG. 2 shows an exploded view from the rear of the CRT display terminal 1 including a logic board enclosure assembly 9 and a power supply 10 which is described in copending related application Ser. No. 278,244 entitled "A Cathode Ray Tube Display Terminal with a Removable Power Supply".

The enclosure assembly 9 includes a pair of "molded-in" slides 40 which guide enclosure assembly 9 along slides 3 to allow connector fingers 32 to plug into a connector 5. Slides 3 are mounted onto a base 22. A snap-in cover 7 supports a read only memory 11 of FIG. 3 and when removed allows for the replacement of the read only memory 11. Read only memory 11 is the character generator for the characters on the face of the CRT display 4.

Projections 27 molded into snap-in cover 7 support the read only memory 11.

When enclosure assembly 9 is fully inserted into CRT display terminal 1, grounding springs 16 of logic board 14, shown in FIG. 5, make contact with upper chassis 37 preventing logic board 14 failures due to electrostatic charge.

Enclosure assembly 9 includes an upper enclosure 12, a lower enclosure 20 and the logic board 14. A screw 24 screws into lower enclosure 20 to hold the enclosure assembly 9 together. The lower enclosure 20 includes a molded-in latch 38 which drops behind base 22 when enclosure assembly 9 is fully inserted into CRT 1.

Line cord 8 plugs into power supply 10 to provide power to CRT 1. Keyboard 2 plugs into connector 18 by means of cable 41 to provide logic signals to electronic components 35 (FIG. 4) mounted on logic board 14.

Figure 3:
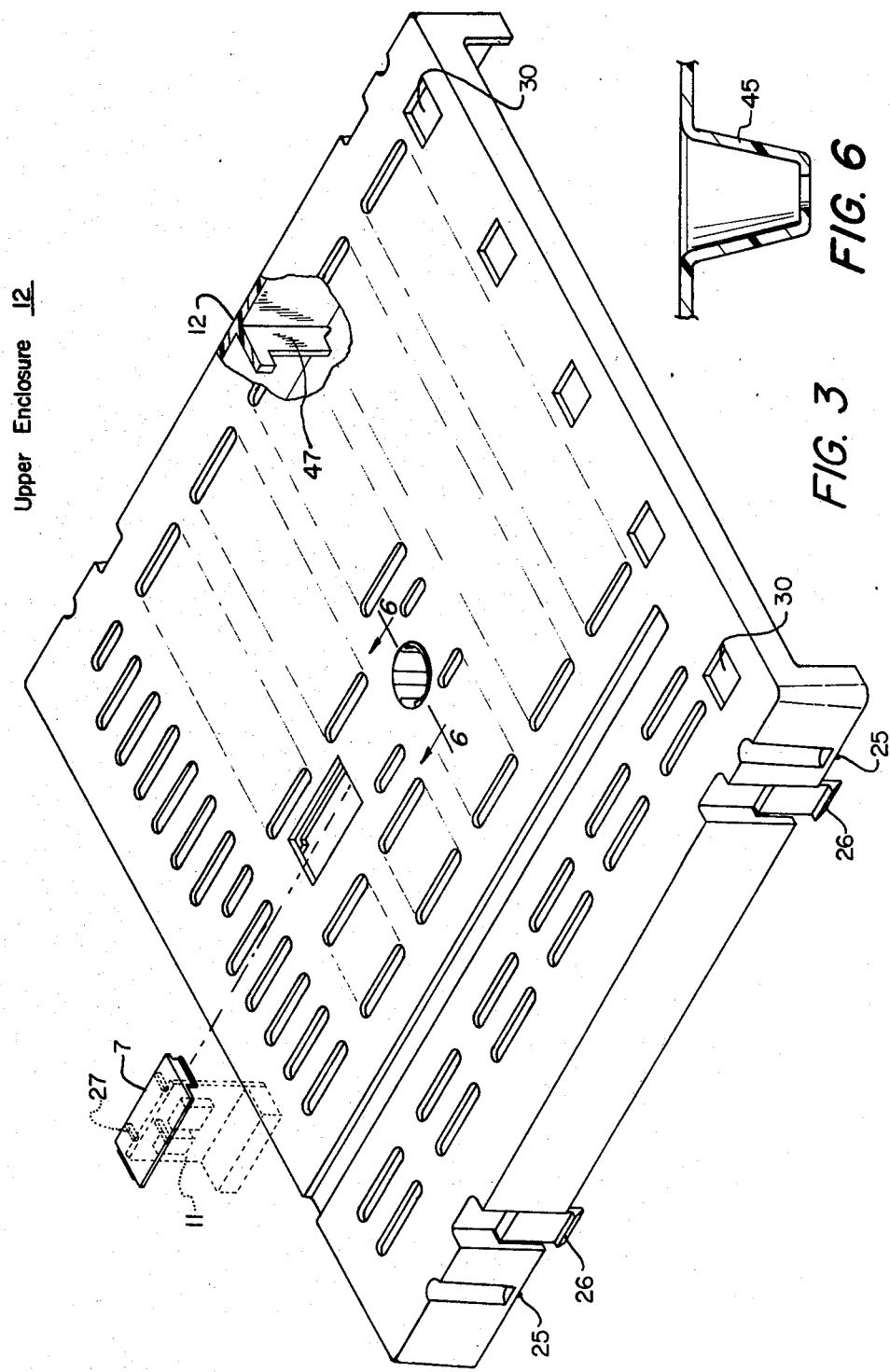
FIG. 3 shows the top portion of the enclosure assembly.

FIG. 3 shows the upper enclosure 12. Openings 30 are provided to allow the grounding springs 16 to project through upper enclosure 12 to make electrical contact with upper chassis 37 of FIG 2. The various openings are provided to allow cooling air to pass over the electronic components 35 soldered to the logic board 14 and into the upper chassis 37 area.

Upper enclosure 12 has 4 locating pins 25 (2 of which are shown in FIG. 3) which with locating holes 29 of FIG. 5 of the lower enclosure 40 accurately align the upper enclosure 12 with lower enclosure 40. This assists in maintaining a fixed relationship between the snap-in cover 7 and the read only memory 11 as well as the logic board 14, molded latch 38 and connector 5. The 4 molded fingers 26 (2 of which are shown in FIG. 3) engage openings 28 of FIG. 5 to keep enclosure assembly 9 together and in proper alignment.

Figure 4:
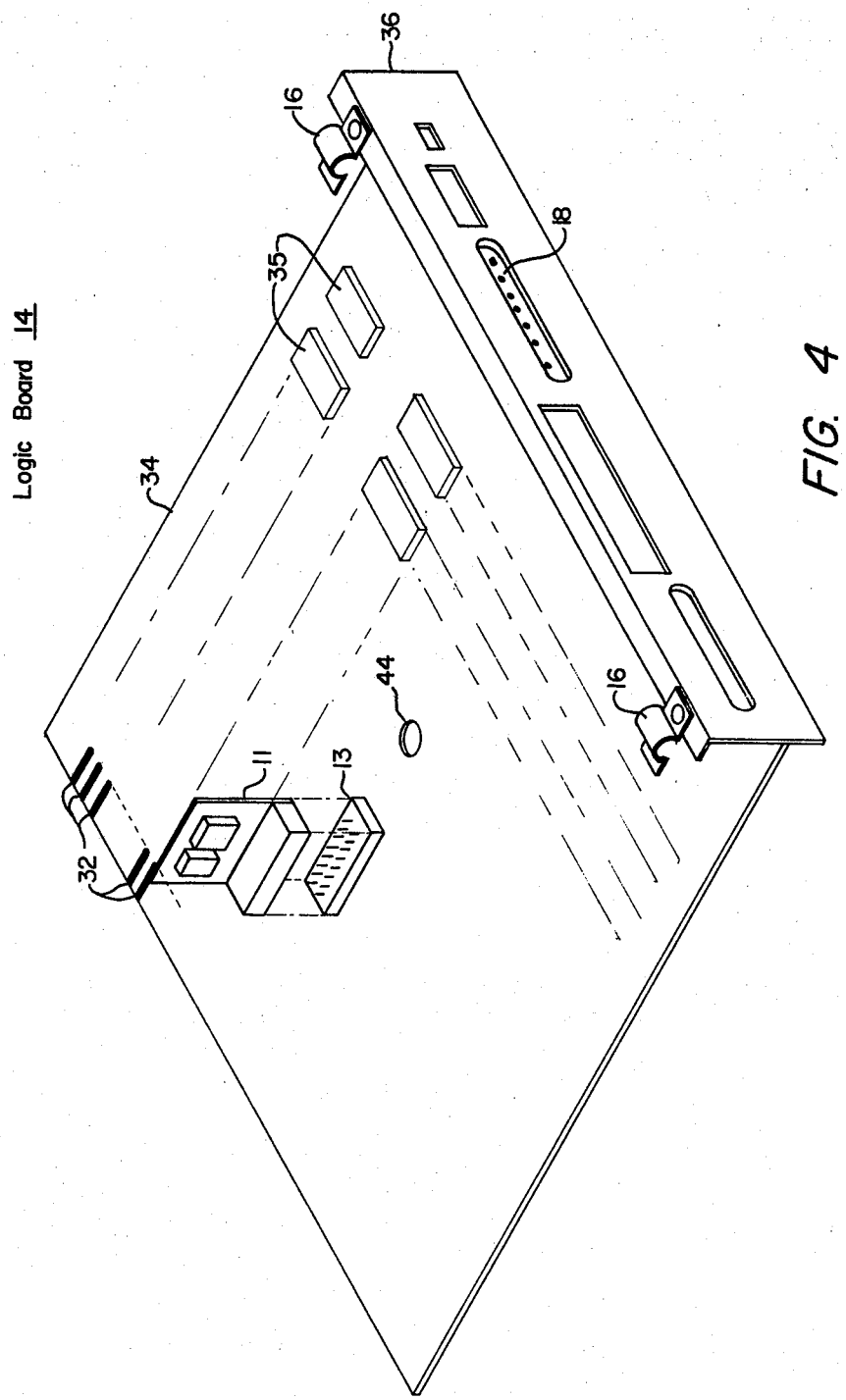
FIG. 4 shows the logic board portion of the enclosure assembly.

FIG. 4 shows the logic board 14 including a printed circuit board 34, a connector panel 36, the grounding springs 16, and connector fingers 32 which make contact with the connector 5 of FIG. 2. A connector 13 is soldered to the printed circuit board 34 as are a multitude of electronic components 35. The read only memory 11 is plugged into connector 13. Connector panel 36 is mounted to a grounding strip (not shown) on printed circuit board 34 and has openings for connectors including connector 18 into which the cable 41 for keyboard 2 is plugged.

FIG. 5 shows the lower enclosure 20. Slides 40 are molded into lower enclosure 20 and slide along slides 3 (FIG. 2) to allow for the proper alignment of the logic board 14 and connector 32 with the conector 5. When the logic board 14 is fully engaged with connector 5, molded latch 38 drops behind base 22 thereby locking enclosure assembly 9 in place. Openings in lower enclosure 20 allow for air flow.

Screw 24 is screwed into tapped hole 42 to hold the enclosure assembly 9 together. This locates the logic board 14 in enclosure assembly 9 since a boss 43 fits into a hole 44 (FIG. 4) of logic board 14 and the head of screw 24 forces molded projection 45 (FIG. 6) against the surface of logic board 14 which surrounds hole 44 when screw 24 is tightened. Also, when the screw 24 is tightened, the edges of the printed circuit board 34 are held firmly between the knife edge projections 46 of the lower enclosure 20 (FIG. 5) and the mating knife edge projections 47 of the upper enclosure 12 (FIG. 3).

Having shown and described a preferred embodiment of the invention, those skilled in the art will realize that many variations and modifications may be made to affect the described invention and still be within the scope of the claimed invention. Thus, many of the elements indicated above may be altered or replaced by different elements which will provide the same result and fall within the spirit of the claimed invention. It is the intention, therefore, to limit the invention only as indicated by the scope of the claims.

What is claimed is:

1. A cathode ray tube display terminal assembled with pluggable units for maintenance by customer personnel including a pluggable logic board enclosure comprising:

a logic board for mounting a plurality of logic elements having connector fingers for plugging into a fixed connector mounted to a chassis of said terminal for providing electrical connections and also including grounding fingers;

a top portion including first locating means for positioning said logic board and clearance openings for allowing said grounding fingers to project through to make electrical contact with said chassis when said enclosure is fully inserted in said terminal, thereby discharging any electrostatic charge on said logic board;

a bottom portion including second locating means for positioning said logic board;

molded-in slides for guiding said enclosure into said terminal and a molded-in snap catch which locks said enclosure in said chassis when said enclosure is fully inserted so that said connector fingers plug into said fixed connector; and locking means for fixing the relative positions of said top portion, said bottom portion and said logic board.

2. The terminal of claim 1 wherein said enclosure further comprises:

one of said plurality of logic elements plugged into a connector mounted on said logic board;

an opening in said top portion for inserting said one of said plurality of logic elements in said logic board connector when said enclosure is assembled; and a snap-in cover locking into said opening of said top cover having a plurality of projections for preventing said one of said plurality of logic elements from loosening.

3. The terminal of claim 1 wherein said first locating means comprises:

a first molded projection for supporting a head of a screw; and a plurality of first knife edge projections for supporting the edges of said logic board.

4. The terminal of claim 3 wherein said second locating means comprises:

a second molded projection having a tapped hole for receiving said screw and having a cylindrical boss which fits into a hole of said logic board; and a plurality of second knife edge projections, each matching each of said plurality of first knife edge projections.

5. The terminal of claim 4 wherein said locking means comprises:

a plurality of locating pins in said top portion;

a plurality of locating holes in said bottom portion;

a plurality of molded fingers in said top portion; and a plurality of molded finger openings in said bottom portion;

wherein said logic board is located between said top portion and said bottom portion, with said top portion being aligned relative to said bottom portion by said plurality of locating pins entering said plurality of locating holes, and said top portion being held relative to said bottom portion by said plurality of molded fingers locking in said plurality of molded finger openings;

said logic board being held between said plurality of first and second knife edge projections.

6. The terminal of claim 5 wherein said locking means further comprises:

said screw being inserted through said first molded projection and being screwed into said tapped hole so that said logic board is squeezed between said first and second molded projections with said cylindrical boss fitting into said hole of said logic board.

7. The terminal of claim 6 wherein said top portion and said bottom portion include a plurality of openings to allow for the passage of air for removing heat from said plurality of logic elements.

* * * * *